United States Patent
Özyilmaz et al.

(10) Patent No.: US 9,184,553 B2
(45) Date of Patent: Nov. 10, 2015

(54) GATE-TUNABLE GRAPHENE-FERROELECTRIC HYBRID STRUCTURE FOR PHOTONICS AND PLASMONICS

(71) Applicant: National University of Singapore, Singapore (SG)

(72) Inventors: Barbaros Özyilmaz, Singapore (SG); Guang Xin Ni, Singapore (SG); Yi Zheng, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 14/405,671

(22) PCT Filed: Jun. 6, 2013

(86) PCT No.: PCT/SG2013/000237
§ 371 (c)(1),
(2) Date: Dec. 4, 2014

(87) PCT Pub. No.: WO2013/184072
PCT Pub. Date: Dec. 12, 2013

(65) Prior Publication Data
US 2015/0155681 A1    Jun. 4, 2015

Related U.S. Application Data

(60) Provisional application No. 61/656,099, filed on Jun. 6, 2012.

(51) Int. Cl.
*H01S 3/11* (2006.01)
*H01S 3/067* (2006.01)
*H01S 3/094* (2006.01)
(Continued)

(52) U.S. Cl.
CPC ............ *H01S 3/1115* (2013.01); *C23C 16/04* (2013.01); *C23C 16/26* (2013.01); *C23C 16/44* (2013.01); *G02F 1/3523* (2013.01); *H01S 3/067* (2013.01);
(Continued)

(58) Field of Classification Search
CPC ......... H01S 3/06791; H01S 3/094046; H01S 3/1115; H01S 3/067; G02F 1/3523; C23C 16/26; C23C 16/44; C23C 16/04
See application file for complete search history.

(56) References Cited

U.S. PATENT DOCUMENTS 6,815,008 B2    11/2004  Ichikawa et al.
2006/0045163 A1*  3/2006  Chuang et al. ............... 372/100
(Continued)

OTHER PUBLICATIONS

Strikha, M.V., "Non-volatile memory and IR radiation modulators based upon graphene-on-ferroelectric substrate. A review", Ukr. J. Phys. Opt., 13(3): S5-S26.*

(Continued)

*Primary Examiner* — Xinning Niu
(74) *Attorney, Agent, or Firm* — Hamilton, Brook, Smith & Reynolds, P.C.

(57) ABSTRACT

The invention relates to a novel type of gate-tunable photonics and plasmonics which utilizes doped large-scale graphene coupled with ferroelectric material. The graphene-ferroelectric hybrid structure paves the way for the realization of ultra-fast, low power consumption and multi-wavelength operation saturable absorbers for applications in ultra-fast laser systems and novel types of plasmonics for applications in infrared detection, single-photon quantum devices and ultrasensitive detectors.

20 Claims, 9 Drawing Sheets

(51) Int. Cl.
*G02F 1/35* (2006.01)
*C23C 16/04* (2006.01)
*C23C 16/26* (2006.01)
*C23C 16/44* (2006.01)

(52) U.S. Cl.
CPC ....... *H01S 3/06791* (2013.01); *H01S 3/094046* (2013.01)

(56) References Cited

U.S. PATENT DOCUMENTS

2009/0310631 A1* 12/2009 Kaertner et al. ............... 372/21
2012/0033690 A1* 2/2012 Renninger et al. ............ 372/25
2012/0039344 A1* 2/2012 Kian et al. ..................... 372/6

OTHER PUBLICATIONS

Notification Concerning Transmittal of International Preliminary Report on Patentability for International Application No. PCT/SG2013/000237, "Gate-Tunable Graphene-Ferroelectric Hybrid Structure for Photonics and Plasmonics", Date of Issuance: Dec. 9, 2014.

Bae, S., et al., "Roll-to-roll production of 30-inch grapheme films for transparent electrodes", *Nature Nanotechnology*, 5: 574-578 (Aug. 2010).

Bonaccorso, F., et al., "Graphene photonics and optoelectronics", *Nature Photonics*, 4: 611-622 (Sep. 2010).

Jana Gana Mana [retrieved on Aug. 16, 2013] [retrieved from the internet <URL:http://www.janaganamana.net/getArticles.aspx?jgmsearch=M.+V.+Strikha>.

Ji, H., et al., "Ultrathin Graphite Foam: A Three-Dimensional Conductive Network for Battery Electrodes", *Nano Lett.*, 12: 2446-2451 (2012).

Ju, L., et al., "Graphene plasmonics for tunable terahertz metamaterials", *Nature Nanotechnology*, 6: 630-634 (Oct. 2011).

Kaura, T., et al., "Simultaneous stretching and corona poling of PVDF films", *J. Phys. D: Appl. Phys.*, 24: 1848-1852 (1991).

Notification of Transmittal of the International Search Report and the Written Opinion of the International Searching Authority, or the Declaration of International Application No. PCT/SG2013/000237, "Gate-Tunable Graphene-Ferroelectric Hybrid Structure for Photonics and Plasmonics", Date of Mailing: Aug. 16, 2013.

Novoselov, K.S., et al., "Electric Field Effect in Atomically Thin Carbon Films", *Science, New Series*, 306(5696): 666-669 (Oct. 22, 2004).

Novoselov, K.S., et al., "Two-dimensional atomic crystals", *PNAS*, 102(30): 10451-10453 (Jul. 26, 2005).

Strikha, M.V., "Non-volatile memory and IR radiation modulators based upon grapheme-on-ferroelectric substrate. A review", *Ukr. J. Phys. Opt.*, 13(3): S5-S26.

Zheng, Y., et al., "Gate-controlled nonvolatile graphene-ferroelectric memory," *Applied Physics Letters*, 94:163505 (2009).

* cited by examiner

GATE-TUNABLE GRAPHENE-FERROELECTRIC HYBRID STRUCTURE FOR PHOTONICS AND PLASMONICS

This application is the U.S. National Stage of International Application No. PCT/SG2013/000237, filed Jun. 6, 2013, which designates the U.S., published in English, and claims the benefit of U.S. Provisional Application No. 61/656,099, filed on Jun. 6, 2012. The entire teachings of the above applications are incorporated herein by reference.

BACKGROUND OF THE INVENTION

Saturable absorber (SA) is a critical component for ultrafast lasers which tunes the continuous wave output into a train of ultrafast optical pulses. The key requirements for a saturable absorber are its wavelength range (where it absorbs), its dynamic response (how fast it recovers), and its saturation intensity and fluence (at what intensity or pulse energy it saturates). They are commonly used for passive Q-switching.

Currently, the dominant technology is based on semiconductor saturable absorber mirrors (SESAMs). However, these have a narrow tuning range, and require complex fabrication and packaging. A simple, cost-effective alternative is to use single-wall carbon nanotubes (SWCNTs), where the diameter controls the gap and thus the operating wavelength. Broadband tunability is possible using SWNTs with wide diameter distribution but the non-uniform chiral properties of SWCNTs present problems for precise control of the properties of the saturated absorber. SWCNTs that are not in resonance can cause insertion losses when operating at a particular wavelength.

Therefore, there remains a need for tunable saturable absorbers with cheaper fabrication, lower power consumption and multi-wavelength operation for applications in ultrafast laser systems and novel types of plasmonics.

SUMMARY OF THE INVENTION

In a first aspect, the present invention relates to a saturable absorber device for use in a laser cavity, comprising an optical element and a saturable absorber material. The saturable absorber material is supported by the optical element and comprises a polarized ferroelectric material and a graphene substrate, wherein the graphene substrate is layered with the ferroelectric material to form a gate tunable graphene-ferroelectric hybrid saturable absorber. The doping level of the graphene-hybrid saturable absorber material is dynamically modifiable via electrostatic gates to tune the resonant wavelength allowing the resonant wavelength for each laser pulse to be individually changed.

The graphene substrate can be a single layer or multi-layer graphene. Examples of graphene substrates include, but are not limited to, a graphene sheet, activated reduced graphene oxide, and a graphene flake, or a combination thereof. The optical element can be, for example, an optical fiber.

In one embodiment, the ferroelectric material is a polymer or copolymer comprised of at least one monomer. The monomers of the ferroelectric polymers or copolymers include, but are not limited to, vinylidene fluoride, trifluoroethylene, 11-aminoundecanoic acid, and thiourea, or a combination thereof. In another embodiment, the ferroelectric material is a ceramic material comprising bismuth ferrite, barium titanate, lead titanate, sodium nitrite, and potassium phosphate, or a combination thereof.

In a further embodiment, the ferroelectric material is a hydrogen-bonded supramolecular polymer or copolymer. Examples of monomers that can be used to make the supramolecular polymer or copolymers of the invention include, but are not limited to, 5,5'-dimethyl-2,2'-bipyridine, 2,5-dichloro-3,6-dihydroxy-p-benzoquinone, 2,5-dibromo-3,6-dihydroxy-p-benzoquinone, and 2,5-diiodo-3,6-dihydroxy-p-benzoquinone, or a combination thereof. In yet another embodiment, the ferroelectric material is an organic-inorganic compound comprising triglycine sulfate, H-1,4-diazabicyclo[2.2.2]octane ammonium perrhenate (H-dab-coReO$_4$), and trisarcosine calcium chloride, or a combination thereof. In another embodiment, the ferroelectric material of the graphene-hybrid saturable absorber material is a ferroelectric thin film.

The graphene-ferroelectric hybrid saturable absorber material can be stacked such that one or more graphene-ferroelectric hybrid saturable absorbers are stacked. The graphene substrate can also be patterned in a micro-shape structure. Examples of micro-shape structures include, but are not limited to, circular arrays and micro-ribbon arrays, or a combination thereof.

The present invention also relates to a fiber laser, comprising a ring or linear laser cavity, and a saturated absorber device arranged within the laser cavity. The saturable absorber device comprises an optical element, and a saturable absorber material supported by the optical element. The saturable absorber material comprises a ferroelectric material and a graphene substrate, wherein the graphene substrate is layered with the ferroelectric material to form a gate tunable graphene-ferroelectric hybrid saturable absorber. In one embodiment, the optical element comprises an optical fiber optionally containing a mode lock assembly wherein the optical fiber and the saturable absorber material are mounted in the beam path on the core of the optical fiber with a mode locker assembly.

The saturable absorber device can be configured in the laser cavity so as to provide at least one of wavelength tuning, mode-locking, Q-switching, optical pulse shaping, optical switching, and optical signal processing.

In another aspect, the invention relates to a method of forming a saturable absorber device, comprising providing an optical element and supporting with the optical element a saturable absorber material comprising a ferroelectric material and a graphene substrate.

In a further aspect, the present invention relates to a method of fabricating the saturable absorber material, comprising depositing a layer of graphene onto a substrate by template-directed chemical vapor deposition (CVD), depositing a layer of ferroelectric material onto the graphene, removing the substrate via wet chemical etching; and doping the material by applying an electric field to thereby obtain the graphene-ferroelectric hybrid saturable absorber material.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 2 (b) shows pictures of the process and device set up, illustrating the scale of the roll-to-roll process.

FIG. 3 (b) is a graph showing a simulation of the saturable absorption as a function of different electrostatic doping levels of graphene. FIG. 3 (c) is a graph showing the transmittance of the graphene on PVDF substrate at visible wavelength. FIG. 3 (d) is a graph showing the normalized Transmittance for non-doped and doped graphene as a function of Input laser intensity.

FIG. 4 (b) is an Illustration of the gate tunability of the graphene layer.

FIG. 5 (c) is a graph of the gate tunability of THz via an external electric field for saturable absorber material plasmonic device in which the graphene substrate is patterned in a micro-ribbon graphene array. FIG. 5 (d) is a graph showing the impact of changing the width of the graphene on the THz signal for the saturable absorber material plasmonic device containing graphene patterned in a micro-ribbon array.

DETAILED DESCRIPTION OF THE INVENTION

Figure 1:
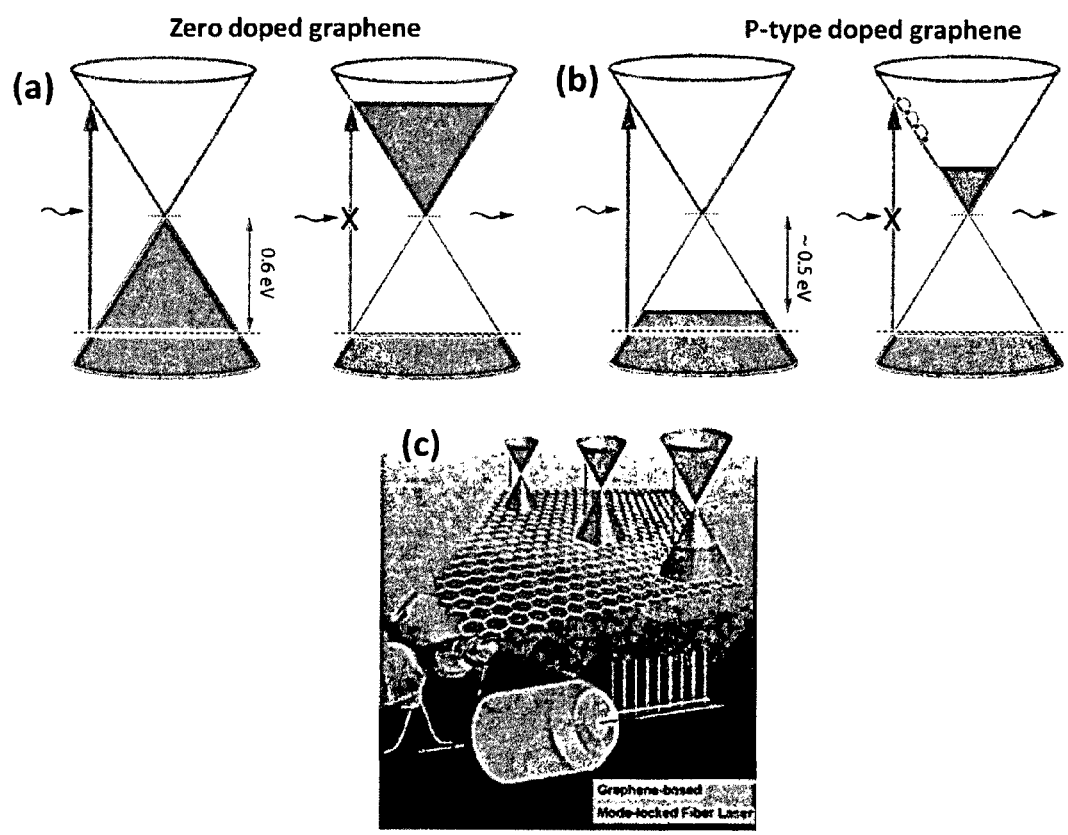
FIG. 1 is a schematic illustration of working principle of graphene-based saturable absorber.

A description of example embodiments of the invention follows. Aspects of the present invention are directed to the use of a polarized ferroelectric material and a graphene substrate, wherein the graphene substrate is layered with the polarized ferroelectric material, as a saturable absorbing material supplied by an optical element (e.g., an optical fiber, a glass substrate, a mirror, etc.) to form a gate tunable graphene-ferroelectric hybrid saturable absorber device. The device is used, for example, in fiber lasers, ultra-fast laser systems, light detectors, optical waveguide and photonic or plasmonic devices. The graphene-ferroelectric hybrid saturable absorber device can exhibit an optical switching operation by a transmittance change accompanying saturable absorption by the graphene-ferroelectric hybrid saturable absorber material. The graphene-ferroelectric hybrid saturable absorber device can also be used for pulse shaping. The graphene can be incorporated as a graphene sheets, graphene film or films, or as composites of graphene and polymer, or as composites of graphene and organic or inorganic materials. The graphene-ferroelectric hybrid saturable absorber device can be used in fiber lasers for optical signal processing, mode locking, Q-switching, optical pulse shaping, optical switching, and the like.

Generally speaking, a saturable absorber is an optical component with a certain optical loss, which is reduced at high light intensity. The main applications of a saturable absorber are in the mode locking and Q-switching of lasers, i.e., the generation of short pulses. However, saturable absorbers can also find applications generally in the processing of optical signals. An aspect of the present invention is the use of a polarized ferroelectric material and a graphene substrate, wherein the graphene substrate is layered with the polarized ferroelectric material as a saturable absorber material for a gate tunable graphene-ferroelectric hybrid saturable absorber device for use in fiber lasers for optical signal processing, mode locking, Q-switching, pulse-shaping and the like.

Graphene, a single atomic layer of $sp^2$-hybridized carbon forming a honeycomb crystal lattice, has a linear energy spectrum near the intersection of the electron and hole cones in the band structure (the Dirac point). Since a 2+1 dimensional Dirac equation governs the dynamics of quasiparticles in graphene, many of its properties differ significantly from those of other materials. The optical conductance of monolayer graphene is defined solely by the fine structure constant, $a=e^2/\hbar c$. The expected absorbance has been calculated and measured to be independent of frequency with a significant fraction ($na=2.293\%$) of incident infrared-to-visible light. In comparison, a 10-nm-thick GaAs layer absorbs about 1% of the light near the band gap. In principle, the photon interband absorption in zerogap graphene could be easily saturated under strong excitation due to Pauli blocking, i.e., the photo generated carriers cool down within subpicosecond to form a hot Fermi-Dirac distribution and the newly created electron-hole pairs block some of the originally possible optical transitions.

As the excitation is increased to high enough intensity, the photo generated carriers have large concentration (much larger than the intrinsic electron and hole carrier densities of about $8 \times 10^{10}$ cm$^{-2}$ in graphene at room temperature) and could cause the states near the edge of the conduction and valence bands to fill, blocking further absorption, thus it becomes transparent to light at photon energies just above the band edge. Band-filling occurs because no two electrons can fill the same state. Thus, saturable absorption or absorption bleaching is achieved due to this Pauli blocking process. In principle, graphene could be a perfect saturable absorber.

FIG. 1 shows a schematic illustration of the working principle of a graphene-based saturable absorber. In FIG. 1 (a), the excitation process responsible for absorption of light in pristine graphene (zero doped graphene) is shown. The arrow in FIG. 1 (a) indicates the optical inter-band transition. At much higher excitation intensity, the photo generated carriers cause the states near the edge of the conduction and valance bands to fill, blocking further absorption. FIG. 1 (b) shows the excitation process responsible for absorption of light in heavily p-type doped graphene. In p-type doped graphene, the number of available excited electrons in the valance band is decreased causing the required saturated intensity to decrease dramatically.

When a saturable absorber in the form of a graphene-ferroelectric hybrid is placed in a lasing cavity, it will favor lower power consumption, and ultrafast and multi-wavelength operation. (FIG. 1 (c)) Using ferroelectric non-volatile gating, doping of large-scale graphene is possible with continual tuning of the doping level of graphene from about $2 \times 10^{12}$ to about $6 \times 10^{14}$ cm$^{-2}$. The doping level of the graphene-ferroelectric hybrid saturable absorber can be modified to tune the resonant wavelength of the saturable absorber.

Figure 2:
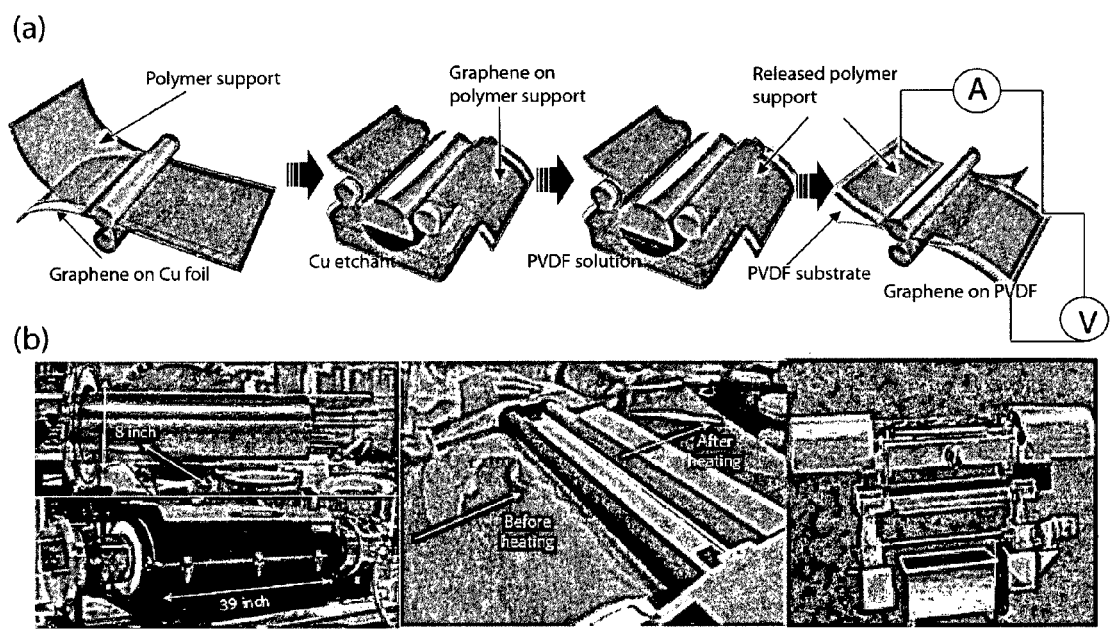
FIG. 2 (a) is a schematic illustration of the roll-to-roll process of large area graphene from Cu foil substrate to PVDF substrate via a sacrificial polymer support layer.

FIG. 2 (a) shows the roll-to-roll process of fabricating the layered graphene-PVDF saturable absorber material from large area chemical vapor deposited (CVD)-graphene on copper foil. The graphene on Cu foil is coated with a supporting polymer layer. The material is rolled through a Cu etchant bath, removing the metal from the graphene. The graphene on the supporting polymer is coated in the next process step with a PVDF layer. The graphene-PVDF layered structure is separated from the supporting polymer resulting in the final saturable absorber material. FIG. 2 (b) shows pictures of the process, illustrating the scale of the roll-to-roll process.

Figure 3:
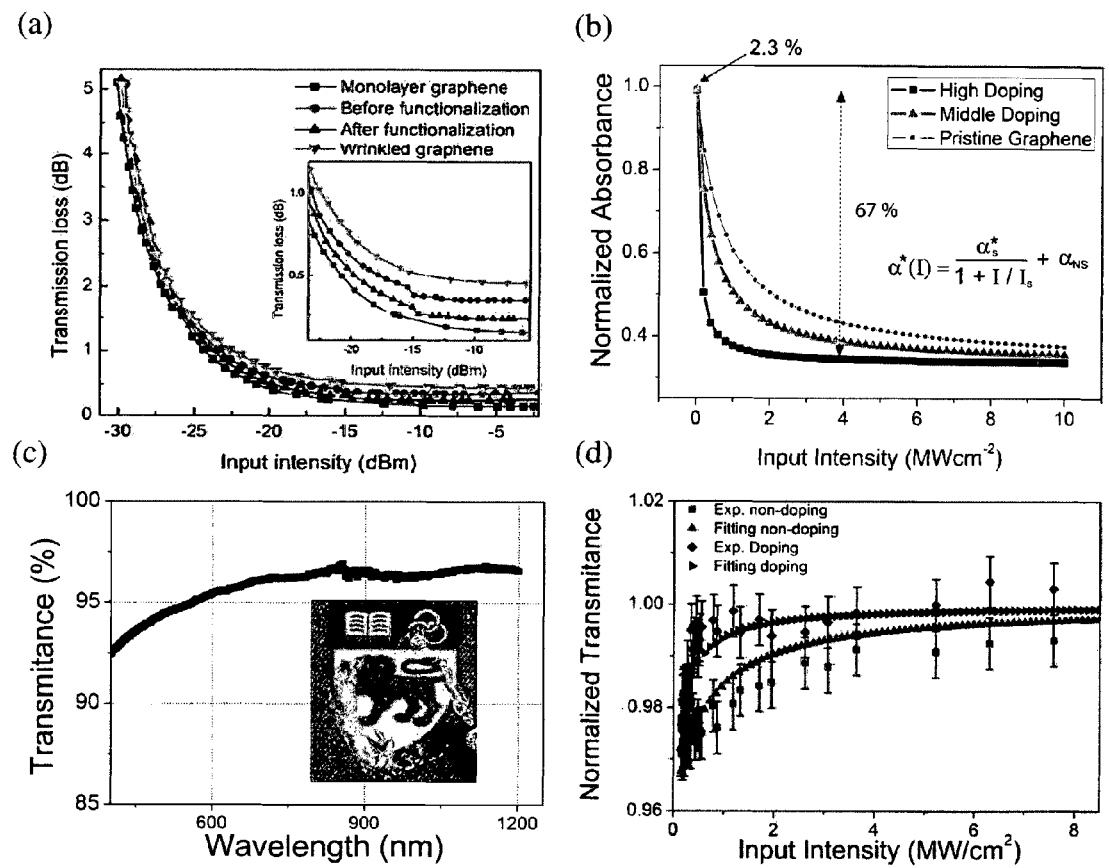
FIG. 3 (a) is a graph showing the absorption saturation of different types of graphene substrates.

FIG. 3 (a) shows the absorption saturation in monolayer graphene, functionalized graphene and wrinkled graphene. The absorption saturation data presented shows very little change in absorption due to the weak doping capability of graphene. FIG. 3 (b) shows a simulation of the saturable absorption of graphene under different doping levels, comparing undoped graphene (zero doping), medium doped graphene ($\sim 4*10^{12}$ cm$^{-2}$) and highly doped graphene ($\sim 2*10^{13}$ cm$^{-2}$). As can be seen in FIG. 3 (b), a much faster absorption with much less power consumption is observed with the increase of the doping level in graphene. The speed of absorption saturation increases monotonically compared to the increase of the doping concentration in graphene. On the other hand, the corresponding required incident power is decreasing as the level of doping increases. The simulated curve in FIG. 3 (b) is normalized at 2.3%, which is the typical absorption coefficient for graphene over a wide wavelength range (e.g., visible to the near infrared).

FIG. 3 (c) shows the corresponding linear optical transmittance of a graphene-ferroelectric hybrid saturable absorber material as a function of wavelength. At visible wavelength, the optical transmittance for the graphene-ferroelectric hybrid saturable absorber material is smooth, nearly featureless, and as high as 95%. Non-linear optical absorption measurement results are shown in FIG. 3 (d). The squares represent experimental results for undoped graphene. As can be seen from FIG. 3 (d), the optical absorption of undoped graphene gradually saturates as the input intensity increases. This is consistent with previous experimental results. However, this is greatly changed when graphene is heavily doped using ferroelectric gating. [3] The diamonds represent experimental Transmittance results for highly-doped graphene. And as can be seen in FIG. 3 (d), the optical absorption saturates much faster for highly-doped graphene when compared to the absorption of undoped graphene. Experimental findings confirm the theoretical simulations, which are depicted as triangles in FIG. 3 (d).

The intensity-dependent attenuation allows the high-intensity components of an optical pulse to pass through graphene thin films, while the lower intensity components of the pulse, such as the pulse wings, pedestals, or the background continuous wave (cw) radiation, does not transmit the graphene film.

Besides use in a saturable device, the graphene-ferroelectric hybrid saturable absorber material can also be used as a plasmon for plasmonics applications, such as the gate tunable plasmonics in THz metamaterials. Plasmonics in THz metamaterials can be widely used in optical waveguides, biosensors and high resolution optical images. Graphene-ferroelectric hybrid plasmons provide a suitable alternative to noble-metal plasmons because they exhibit much larger confinement and relatively long propagation distances, combined with the advantage of being highly tunable via electrostatic gating. Compared to conventional ionic gel dielectrics used to dope graphene which require a consistent power supply due to its linear dielectric response, the graphene-ferroelectric hybrid saturable absorber material requires zero power consumption. [4] This could be very important for the potential applications including detection, single-photon quantum devices, and ultrasensitive detectors.

Figure 4:
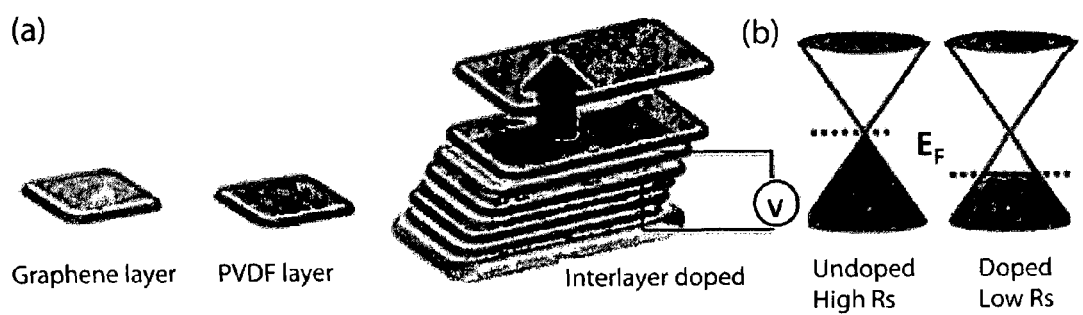
FIG. 4 (a) is a schematic illustration of a stacked graphene-PVDF saturable absorber device.

FIG. 4 shows a schematic illustration of stacked graphene-PVDF saturable absorber layers. A stack of graphene-PVDF layers can also be utilized as a saturable absorber material. FIG. 4 (a) shows the stacked graphene and PVDF layers, while the insert shows the polarization of the PVDF. The stacking of multiple layers enhances the saturable absorber device performance, as the total absorption of the device is comprised of the combined absorption of each layer.

Figure 5:
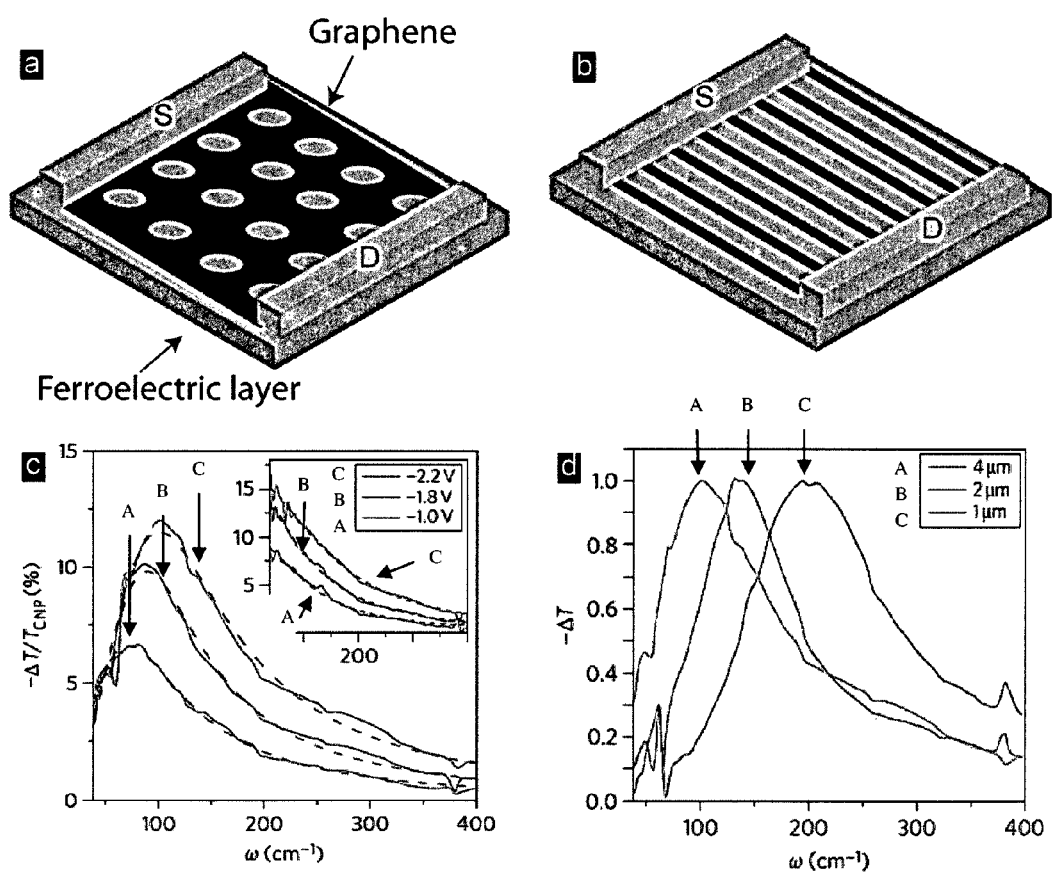
FIGS. 5 (a) and (b) show a schematic illustration of a graphene-ferroelectric hybrid saturable absorber material plasmonic device structure for tunable THz metamaterials.

FIG. 5 (a) shows a schematic illustration of a graphene-ferroelectric hybrid saturable absorber material plasmonic device structure for tunable THz metamaterials. The graphene substrate (e.g., graphene sheet) can be patterned into different micro-shape structures, such as circular and ribbon shapes (FIG. 5 (b)), depending on the specific requirement, and locally doped through the non-volatile ferroelectric layer. FIGS. 5 (c) and (d) shows the THz response of such devices tuned by either doping level (FIG. 5 (c)) or lateral size of patterned structures (FIG. 5 (d)).

In a first aspect, the invention relates to a saturable absorber device for use in a laser cavity, comprising an optical element, and a saturable absorber material supported by the optical element and comprising a polarized ferroelectric material and a graphene substrate, wherein the graphene substrate is layered with the ferroelectric material to form a gate tunable graphene-ferroelectric hybrid saturable absorber. The doping level of the graphene-hybrid saturable absorber is dynamically modifiable via electrostatic gates to tune the resonant wavelength. "Dynamically modifiable," as used herein, is defined as the ability to change the resonant wavelength for each laser pulse individually. In other words, the resonant wavelength of the laser can be changed on a pulse-to-pulse basis.

Graphene is a two dimensional sheet of carbon that has highly desirable physical properties. Graphene is the strongest material known having a Young's modulus of 0.5-1 TPa, yet it is extremely flexible and not brittle. Graphene can be transferred onto any flat or irregular shaped surface and graphene-coated, flexible, supporting substrates can be easily bent into any shape required. While graphene is usually found in its two dimensional form, it is now possible to fabricate the graphene in a three dimensional intercalated network, known as graphene foam or 3-D graphene.

"Graphene," as the term is used herein, is defined as single or multiple layers of graphene sheets. [1,2] The graphene as considered in the present invention describes the material, and is not restricted by the methods used to prepare the material. Such methods include, but are not limited to, mechanical exfoliation, epitaxial growth, chemical vapor deposition and chemical processed (solution processed) methods, as well as laser ablation and filtered cathodic arc methods. In one embodiment, graphene is multi-layer graphene. The term "multi-layer graphene" refers to graphene that has multiple layers of single atomic layer graphene. The graphene of the present invention can have between about 1 to about 20 layers. Preferably, the graphene has between about 10 to about 20 layers, more preferably between about 5 to about 10 layers, most preferably between about 1 to about 5 layers. In another embodiment of the invention, the graphene is single layer graphene.

As used herein, the term "single layer graphene" refers to a graphene monoatomic sheet that has less than or about 5% two or three layer graphene. For example, graphene grown on copper is self-terminating producing single layer graphene that has less than 5% two and three layer graphene flakes. In one non-limiting embodiment, the graphene has about 5% two and three layer graphene. In another embodiment, graphene has less than 5% two and three layer graphene.

Graphene is a single atomic layer of $sp^2$-hybridized carbon forming a honeycomb crystal lattice. One atomic layer of graphene absorbs a significant fraction (2.293%) of incident light from infrared wavelengths to visible wavelengths. The photon interband absorption in zero-gap graphene could be easily saturated under strong excitation due to Pauli blocking. The doping of graphene with ferroelectric materials allows the continuous tuning of the wave output into a train of ultrafast optical pulses. Therefore, a graphene layers with a ferroelectric material can be used as a saturable absorber material to form a wideband tunable saturable absorber device for photonics devices such as fiber lasers.

The term "graphene-substrate," as used herein is defined as graphene, a graphene derivative, functionalized graphene, or a combination thereof. The graphene substrates of the present invention include, but are not limited to graphene, graphene foams, activated reduced graphene oxide, functionalized or derivatized graphene, graphene-polymer composites, and graphene flakes, or a combination thereof supported by an optical element (e.g., on the end facet of an optical fiber) as saturable absorber for the mode locking of lasers. A "graphene flake" is defined as a quasi-two-dimensional thin film made of a number of graphene layers (e.g., ranging from one layer to a thousand layers. Such flakes can be composed of either a single layer or multi-layers of graphene. Graphene of the invention includes, but is not limited to, chemical vapor deposited graphene, epitaxial grown graphene, mechanical exfoliated graphene, and chemically modified graphene, or a combination thereof. As used herein, "functionalized or derivatized graphene" refers to the chemical attachment of chemical functional groups or dye molecules on the graphene or graphene oxide for the purpose of modifying its solubility, dispersability, electronic and optical properties.

The graphene substrates can be single or multiple layers graphene. In one embodiment, graphene substrate is multi-layer graphene. The graphene substrates can have between about 1 to about 20 layers. Preferably the graphene substrate has between about 10 to about 20 layers, more preferably between about 5 to about 10 layers, most preferably between about 1 to about 5 layers. In another embodiment of the invention, the graphene substrate is single layer graphene. In one non-limiting embodiment, the graphene substrate has about 5% two and three layer graphene. In another embodiment, graphene substrate has less than 5% two and three layer graphene. The graphene substrate can also be patterned into various micro-shape structures. For example, the graphene substrate can be patterned in a circular array, a micro-ribbon array, or a combination thereof. (FIG. 4)

As used herein, a "ferroelectric material" refers to a material that maintains a permanent electric polarization that can be reversed, or switched in the presence of an external electric field. The ferroelectric material of the invention can be a ferroelectric thin film.

In one embodiment, the ferroelectric material is a ferroelectric polymer or copolymer. As used herein, a "ferroelectric polymer" refers to polymers that maintain a permanent electric polarization that can be reversed, or switched in the presence of an external electric field. The ferroelectric polymer can be a polymer or a copolymer. As used herein, the term "polymer" refers to a macromolecule made of repeating monomer units. The term "copolymer" is defined as a polymer of at least two chemically distinct monomers. The copolymers of the invention include, but are not limited to, alternating copolymers, statistical copolymers, block copolymers, random copolymer, and graft copolymers. In one embodiment, the polymer used to form the ferroelectric polymer is a polymer comprising at least one monomer. In another embodiment, the polymer used to form the ferroelectric polymer is a copolymer comprising one or more monomers.

The monomers that can be used to synthesize the ferroelectric polymers or copolymers of the present invention include, but are not limited to, vinylidene fluoride, trifluoroethylene, chlorotrifluoroethylene, tetrafluoroethylene, hexafluoropropylene, 1,1-chlorofluoroethylene, 11-aminoundecanoic acid, and thiourea, or a combination thereof. The ferroelectric polymers of the present invention can be a copolymer comprising two or more monomers. In one embodiment, the ferroelectric polymer is polyvinylidene fluoride (PVDF). In another embodiment, the ferroelectric polymer is vinylidene fluoride oligomer. In yet another embodiment, the ferroelectric polymer is polyamide 11 (nylon-11). "Polyamide 11," as defined herein, is a polymer composed of the monomer 11-aminoundecanoic acid. In another embodiment, the ferroelectric polymer is a thiourea polymer.

In another embodiment of the invention, the ferroelectric material can be a ceramic material with the structural formula $ABO_x$. As defined herein, "x" is an integer between about 1 and about 20. Preferably x is between about 1 and about 15, more preferably between about 1 and about 10, and most preferably between about 1 and about 5. For example, ceramic materials that can be used as part of the invention include, but are not limited to, bismuth ferrite ($BiFeO_3$), barium titanate ($BaTiO_3$), lead titanate ($PbTiO_3$), sodium nitrite ($NaNO_2$), and potassium phosphate ($KH_2PO_4$), or a combination thereof.

In a further embodiment, the ferroelectric material can be a hydrogen-bonded supramolecular polymer or copolymer. As defined herein, a "supramolecular polymer" or "supramolecular copolymer" is a polymer or copolymer whose monomer repeat units are held together by noncovalent bonds. Non-covalent forces that hold supramolecular polymers together include coordination, $\pi$-$\pi$ interactions, and hydrogen bonding. The monomers that can be used to synthesize the supramolecular polymer or copolymer include, but are not limited to, 5,5'-dimethyl-2,2'-bipyridine, phenazine, 2,5-dichloro-3,6-dihydroxy-p-benzoquinone, 2,5-dibromo-3,6-dihydroxy-p-benzoquinone, and 2,5-diiodo-3,6-dihydroxy-p-benzoquinone, or a combination thereof.

In another embodiment, the ferroelectric material can be an organic-inorganic compound comprising triglycine sulfate (TGS), H-1,4-diazabicyclo[2.2.2]octane ammonium perrhenate (H-dabcoReO$_4$), and trisarcosine calcium chloride (TSCC), or a combination thereof.

Advantageously, a ferroelectric thin film or a layer of ferroelectric material can be placed onto a graphene substrate with or without uniform layers and assembled onto the end facet of an optical fiber as a saturable absorber. The graphene substrate can be patterned in a micro-shape structure. For example, the graphene comprising a circular array, a micro-ribbon array, or a combination thereof.

The ferroelectric material layer may be under or over the graphene substrate or sandwiched on either side. In another aspect of the invention, one or more graphene-ferroelectric hybrid saturable absorbers are stacked. The stacks may contain alternating layers or random layering of the graphene substrate and the ferroelectric material. For example, in FIG. 4 a sandwiched graphene-ferroelectric hybrid saturable absorber multilayer structure is shown. This sandwiched multilayer structure is one way to add more functionality and enhance the performance of the graphene-ferroelectric hybrid saturable absorber material.

FIG. 4 (a) shows stacked alternating graphene layers and ferroelectric film layers (e.g., PVDF thin film). After polarization of each ferroelectric layer using graphene as contacts, all the stacked graphene films become highly doped. The insert shows the polarization of the stacked graphene PVDF hybrid material. As a result, its absorption saturation under higher input intensity will not only provide another strategy for a saturable absorber, but also offer a much higher transmittance due to the decrease of absorption. For example, if we take four layer pristine graphene together, its linear transmittance would be 90%. Using this approach, the large transmittance of multi-layer graphene can be still as high as 100%. This could be critical for other techniques where high transmittance is needed.

FIG. 4 (b) shows the corresponding band structure of undoped and doped graphene. Using this approach, high transparent films can be obtained due to the absorption saturation.

The optical element of the present invention can comprise an optical fiber and can further comprise a fiber holder to hold the optical fiber. In one non-limiting embodiment, the fiber holder and the optical fiber together can comprise a fiber pigtail.

According to a second aspect of the invention, there is provided an optical fiber assembly comprising a polarized ferroelectric material and a graphene substrate, wherein the graphene substrate is layered with the ferroelectric material to form a gate tunable graphene-ferroelectric hybrid saturable absorber material assembled or deposited on an optical fiber. The optical fiber assembly comprises an example embodiment of a graphene-ferroelectric hybrid saturable absorber device. In one embodiment, the optical fiber assembly comprises graphene-ferroelectric hybrid saturable absorber assembled on the end facet of an optical fiber. In another embodiment of the second aspect of the invention, the optical fiber assembly comprises a film made from a graphene substrate and a ferroelectric material, transferred to the optical fiber end facet.

Figure 6:
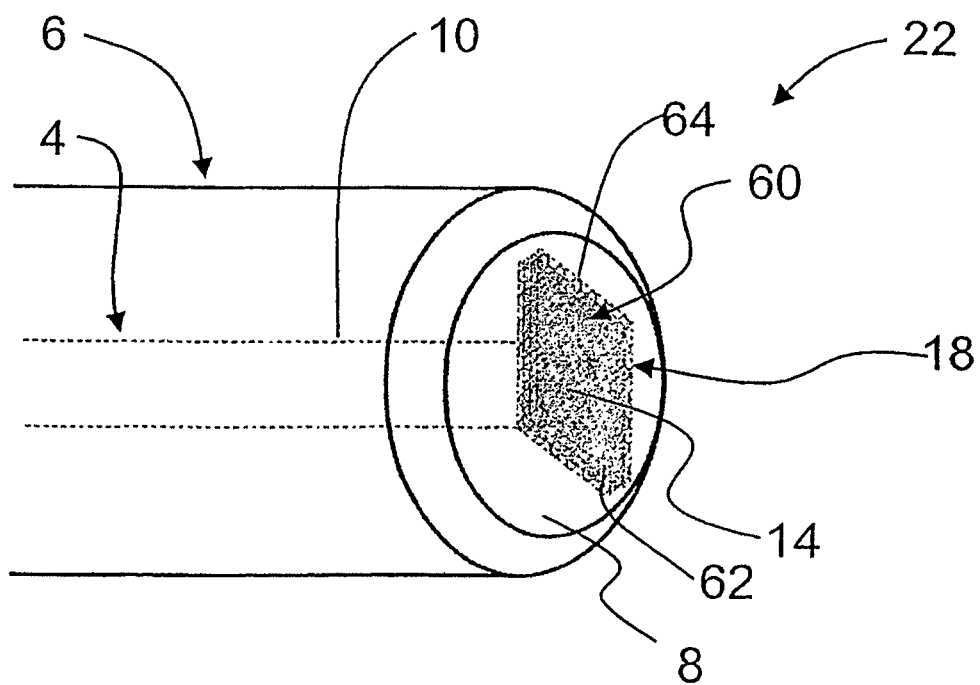
FIG. 6 is perspective, close-up end view of a saturable absorber device in the form of an optical fiber held within a ferrule, the fiber having an end facet that has assembled thereon a saturable absorber material comprising a polarized ferroelectric material and a graphene substrate.

FIG. 6 is perspective view of optical fiber/fiber cladding 10 surrounded by ferrule/fiber facet 6 (ferrule 6 holds the optical fiber 10) having a graphene-based saturable absorber material/mounted saturable absorber device 18 in the form of a graphene-ferroelectric hybrid saturable absorber/graphene sheet 60 assembled on ferrule endface 8 covering pinhole/fiber core 4 and fiber end facet/gate contact 14, wherein the graphene-ferroelectric hybrid saturable absorber is formed from a polarized ferroelectric material and a graphene substrate, wherein a graphene substrate 64 is layered with a polarized ferroelectric material/gate contact 62, such as PVDF. The saturable absorber device 22 of FIG. 6 is suitable for use in mode locking and Q-switching fiber lasers, as described below.

Figure 7:
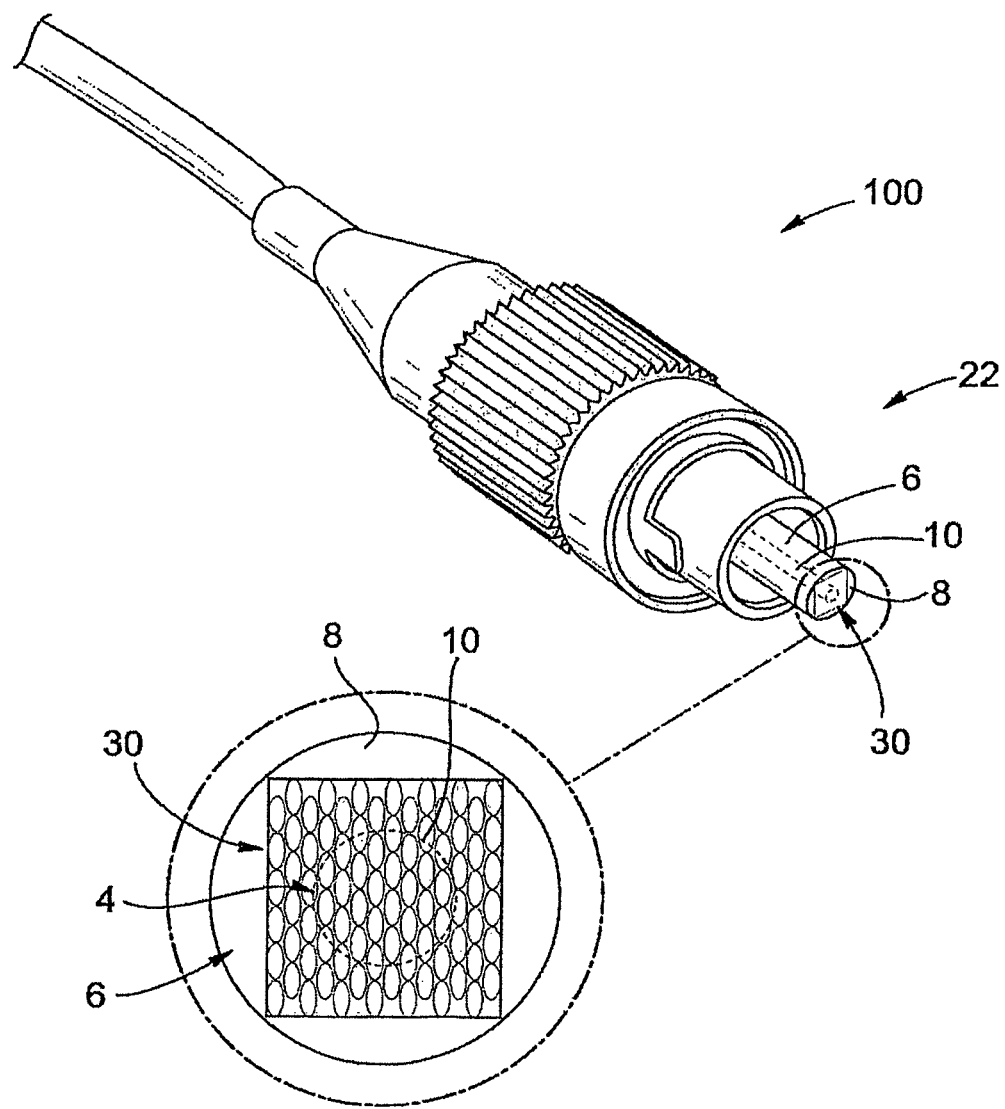
FIG. 7 is a perspective view of a saturable absorber device in the form of a fiber pigtail with a multilayer graphene film arranged on the fiber pigtail end.

FIG. 7 is a schematic of a fiber pigtail 100 (containing the saturable absorber device 22) with ferrule/fiber facet 6 that holds optical fiber/fiber cladding 10, with graphene-ferroelectric hybrid saturable absorber 30 on endface 8 covering pinhole/fiber core 4 and fiber end facet/gate contact 14. Fiber pigtail 100 is inserted into a fiber laser to generate mode locking or Q-switching pulses.

According to a third aspect of the invention there is provided a method for preparing an optical fiber assembly comprising a graphene-ferroelectric hybrid saturable absorber material, which comprises: a) preparing a graphene-ferroelectric hybrid saturable absorber material, and b) transferring the graphene-ferroelectric hybrid saturable absorber material to the end facet of an optical fiber.

In another aspect, the invention relates to a saturable absorber material for use in a plasmonic device, comprising a polarized ferroelectric material and a graphene substrate, wherein the graphene substrate is patterned in a micro-shape structure and layered with the ferroelectric material to form a tunable graphene-ferroelectric hybrid plasmonic device. The graphene substrate can be patterned in a micro-shape structure comprising a circular array, a micro-ribbon array, or a combination thereof. (FIG. 5)

In further aspect, the invention relates to a fiber laser, comprising a ring or linear laser cavity and a saturated absorber device arranged within the laser cavity, the saturable absorber device, comprising an optical element, and a saturable absorber material supported by the optical element, the saturable absorber material, comprising ferroelectric material and a graphene substrate, wherein the graphene substrate is layered with the ferroelectric material to form a gate tunable graphene-ferroelectric hybrid saturable absorber. The saturable absorber device can be configured in the laser cavity so as to provide at least one of wavelength tuning, mode-locking, Q-switching, optical pulse shaping, optical switching, and optical signal processing. As defined herein, a "fiber laser" is defined as a laser in which the active gain medium is an optical fiber doped with rare-earth elements such as erbium, ytterbium, neodymium, dysprosium, praseodymium, and thulium. The optical element can comprise an optical fiber that may optionally contain a mode lock assembly as part of the optical fiber. The saturable absorber material can be mounted in the beam path on the core of the optical fiber with a mode locker assembly.

Figure 8:
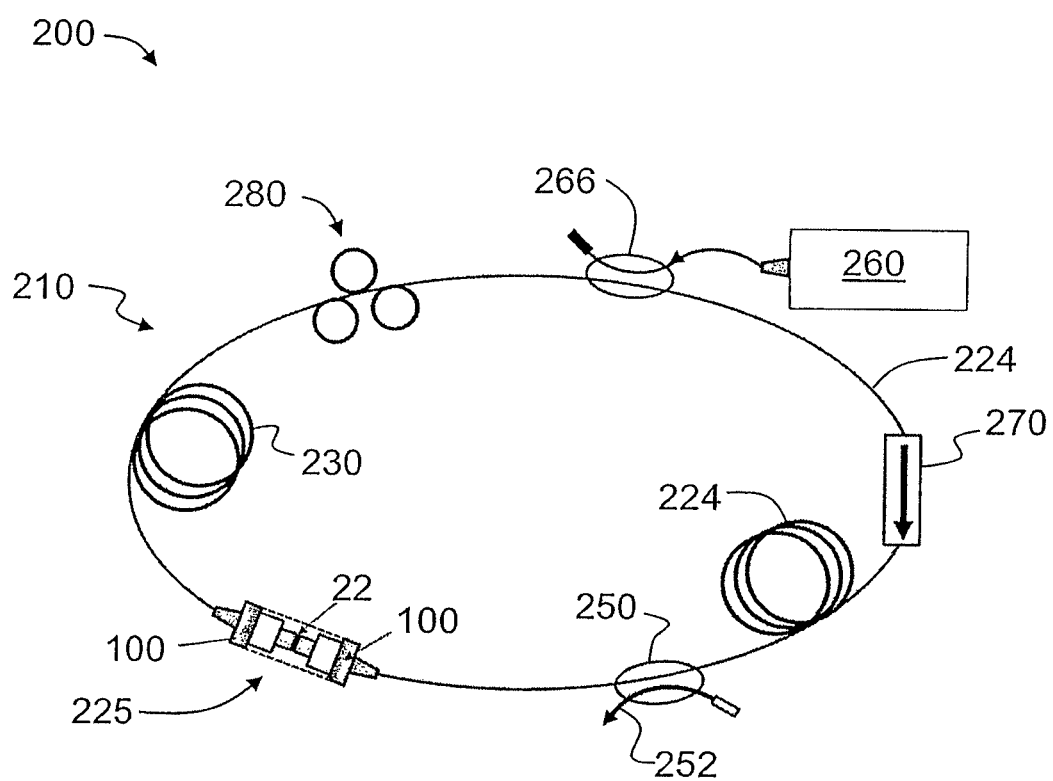
FIG. 8. is a schematic diagram of an example fiber laser having a ring cavity that uses a graphene-ferroelectric hybrid saturable absorber device.

FIG. 8 is a schematic diagram of a fiber laser 200 having a ring cavity/ring resonator assembly 210 designed for mode locking and Q-switching by using graphene-ferroelectric hybrid saturable absorber device 22. To obtain unambiguous evidence of soliton mode locking (i.e., clear solitonic sibebands), an extra single-mode fiber (SMF)/optical fiber/optical delay (2) 224 can be added to compensate for the normal dispersion of graphene so that the net cavity dispersion becomes anomalous. The two interfaced fiber pigtails/fiber connector 100 in ring cavity/ring resonator assembly 210 constitute a "graphene substrate-ferroelectric material mode locker"/mode locker assembly 225 that includes a graphene-based saturable absorber device 22.

The fiber laser 200 can have a ring cavity/ring resonator assembly 210 having a section of 6.4 m erbium-doped fiber (EDF)/optical delay (1) 230 with group velocity dispersion (GVD) of 10 ps/km/nm, 8.3 m (6.4 m) and a SMF/optical fiber/optical delay (2) 224 with GVD 18 ps/km/nm. If solitonic sidebands are observed after an extra 100 m of SMF/optical fiber/optical delay (2) 224 is added in the cavity, this may demonstrate that the net cavity dispersion is anomalous in the present cavity. A 10% fiber coupler/output coupler 250 is used to output the signal (as indicated by arrow 252).

Fiber laser 200 can be pumped by a high power fiber Raman laser source/pump laser 260 (BWC-FL-1480-1) of wavelength 1480 nm, which is coupled into laser cavity/ring resonator assembly 210 using a wavelength-division multiplexer (WDM)/input coupler 266. A polarization-independent isolator/isolator 270 can also be spliced into laser cavity/ring resonator assembly 210 to force the unidirectional operation. An intra-cavity polarization controller/pulse control 280 can be used to change the cavity linear birefringence.

Figure 9:
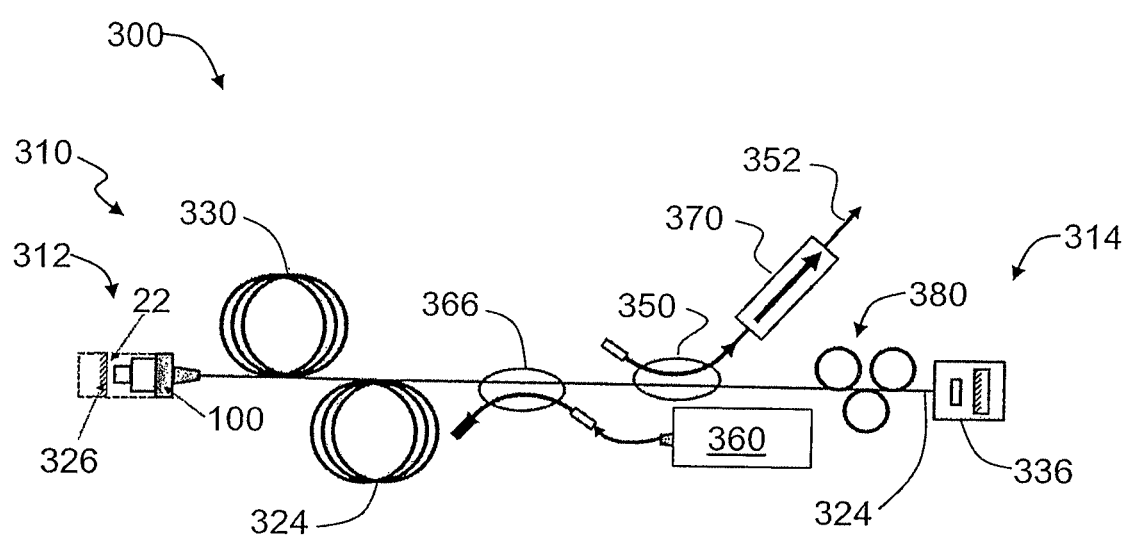
FIG. 9 is a schematic diagram of a fiber laser having a linear cavity that uses a graphene-ferroelectric hybrid saturable absorber device.

FIG. 9 is a schematic diagram of a fiber laser 300 having a linear cavity 310 designed for mode locking and Q-switching by using the graphene-ferroelectric hybrid saturable absorber device 22. The saturable absorber material/mounted saturable absorber device 18 for the graphene-ferroelectric hybrid saturable absorber device 22 includes, for example, various graphene substrates and ferroelectric materials that can be coated as a film onto an optical element in the form of highly reflective mirror/adaptor 326, which enables saturable absorber device 22 to operate in a reflective mode.

Mirror/adaptor 326, together with graphene-ferroelectric hybrid saturable absorber 30 (see e.g., FIG. 7), is adhered to the fiber end facet/gate contact 14 of fiber/fiber cladding 10 supported in pigtail 100, which is placed at one end 312 of the linear cavity 310. Linear cavity 310 includes SMF/optical delay (2)/optical fiber 324 and EDF/optical delay (1) 330. At the opposite side 314 of linear cavity 310, a Faraday mirror/mirror 336 is spliced to SMF/optical delay (2)/optical fiber 324. A fiber coupler/output coupler 350 is used to output the signal through an isolator 370, with the outputted signal/output beam denoted by 352.

Fiber laser 300 can be pumped by a high power fiber Raman laser source/pump laser 360 (BWC-FL-1480-1) of wavelength 1480 nm, which is coupled to linear cavity 310 via a WDM/input coupler 366. An intra-cavity polarization controller/pulse control 380 can be used to change the cavity linear birefringence. Bi-directional oscillation can be achieved in laser cavity 310.

According to another aspect of the invention, the invention relates to a method of forming a saturable absorber device, comprising providing an optical element, and supporting with the optical element a saturable absorber material comprising a ferroelectric material and a graphene substrate.

In another aspect, the invention relates to a method of fabricating the saturable absorber material, comprising depositing a layer of graphene onto a substrate by template-directed chemical vapor deposition (CVD), depositing a layer of ferroelectric material onto the graphene, removing the substrate via wet chemical etching, and doping the material by applying an electric field to thereby obtain the graphene-ferroelectric hybrid saturable absorber material.

The deposition of the layer of the ferroelectric material can be performed using various methods. Examples of methods that can be used to deposit the ferroelectric material on the graphene substrate include, but are not limited to, spin casting, bar-coater method and roll-to-roll processes. [6,7] The deposition of the ferroelectric layer and removal of the substrate via chemical etching can be combined and performed using roll-to-roll technique. (FIG. 3). The graphene ferroelectric hybrid saturable absorber material can be polarized using various methods. For example, the graphene-ferroelectric hybrid saturable absorber material can be polarized using the corona poling technique to obtain the desired remnant polarization state of the ferroelectric material layer. [8]

Chemical vapor deposition (CVD) refers to a chemical process used to produce high-purity, high-performance solid materials where a template is exposed to one or more volatile precursors, which react and/or decompose on the template surface to produce the desired deposit. Graphene can be directly deposited using CVD onto any template suitable for preparation of graphene. Templates are not limited to planar substrates but can be three dimensional forms of nickel, copper or any other material facilitating the growth of graphene. For example, the template can be a foam-like shape (e.g., nickel foam). All of the templates can be subsequently removed by chemical wet etching. [5]

Templates that may be used for growing graphene include, but are not limited to, nickel, copper, scandium, titanium, vanadium, manganese, iron, cobalt, ruthenium, platinum, silicon carbide (SiC), and may include also non-metal or non-oxide substrates.

To prevent collapse of the graphene substrate upon removal of the metal template, a thin layer of polymer (e.g., poly (methylmethacrylate) (PMMA)) can be deposited onto the graphene prior to removal of the metal template. For example, PMMA can easily be removed from the graphene substrate after chemical etching using hot acetone. Once the metal template is removed, the graphene substrate can be layered with the desired ferroelectric material. In one embodiment, a polymer support is deposited on the graphene substrate prior to chemical etching. In another embodiment, the polymer support deposited on the graphene substrate prior to chemical etching is poly(methylmethacrylate). In yet another embodiment, the polymer support is not removed until the ferroelectric material is layered onto the graphene supported by the polymer. The skilled person can readily recognize the solvent (s) to be used for the removal of the polymer support.

The metal template is removed via chemical etching to provide the graphene-ferroelectric hybrid material. Chemical etching as defined herein is a process of using acids, bases or other chemicals to dissolve a metal template. For example, a nickel template can be removed after chemical vapor deposition of graphene using hot hydrochloric acid (HCl) or HCl/iron chloride ($FeCl_3$) solution of the nickel to provide the graphene-ferroelectric hybrid material.

One or more of the above-disclosed embodiments, in addition to certain alternatives, are provided in further detail below with reference to the attached Figures. The invention is not limited to any particular embodiment disclosed and is defined by the scope of the claims.

REFERENCES

1. K. S. Novoselov, D. Jiang, F. Schedin, T. J. Booth, V. V. Khotkevich, S. V. Morozov, A. K. Geim, *PNAS*, 102, 30, 10451 (2005).
2. K. S. Novoselov, A. K. Geim, S. V. Morozov, D. Jiang, Y. Zhang, S. V. Dubonos, L. V. Grigorieva, A. A. Firsov, *Science*, 306, 5696, 666, (2004).
3. Y. Zheng et al., Appl. Phys. Lett. 94, 163505 (2009).
4. L. Ju, B. Geng, J. Horng, C. Girit, M. Martin, Z. Hao, H. A. Bechtel, X Liang, A. Zettl, Y. R. Shen and F. Wang, *Nature Nanotech*, 6, 630, (2011).
5. H. X. Ji, L. L. Zhang, M. T. Pettes, H. F. Li, S. S. Chen, L. Shi, R. Piner, R. S. Ruoff, *Nano Lett*, 12, 5, 2446 (2012).
6. S. Bae, H. Kim, Y. Lee, X. Xu, J.-S. Park, Y. Zheng, J. Balakrishnan, T. Lei, H. R. Kim, Y. I. Song, Y.-J. Kim, K. S. Kim, B. Özyilmaz, J.-H. Ahn, B. H. Hong, S. Iijima, *Nature Nano*, 5, 574, (2010).
7. U.S. Pat. No. 6,815,008, K. Ichikawa, G. Nishino, N. Kaneko.
8. T. Kaura, R. Nath, M. M. Perlman, *J. Phys. D: Appl. Phys.* 24, 1848, (1991).

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A saturable absorber device for use in a laser cavity, comprising:
    an optical element; and
    a saturable absorber material supported by the optical element and comprising a polarized ferroelectric material and a graphene substrate, wherein the graphene substrate is layered with the ferroelectric material to form a gate tunable graphene-ferroelectric hybrid saturable absorber.

2. The saturable absorber device of claim 1, wherein the graphene substrate is single layer graphene, multi-layer graphene, a graphene sheet, activated reduced graphene oxide, a graphene flake, or a combination thereof.

3. The saturable absorber device of claim 1, wherein the ferroelectric material is a polymer or copolymer comprising vinylidene fluoride, trifluoroethylene, 11-aminoundecanoic acid, thiourea, or a combination thereof.

4. The saturable absorber device of claim 1, wherein the ferroelectric material is a ceramic material comprising bismuth ferrite, barium titanate, lead titanate, sodium nitrite, potassium phosphate, or a combination thereof.

5. The saturable absorber device of claim 1, wherein the ferroelectric material is a hydrogen-bonded supramolecule polymer or copolymer comprising 5,5'-dimethyl-2,2'-bipyridine, 2,5-dichloro-3,6-dihydroxy-p-benzoquinone, 2,5-dibromo-3,6-dihydroxy-p-benzoquinone, 2,5-diiodo-3,6-dihydroxy-p-benzoquinone, or a combination thereof.

6. The saturable absorber device of claim 1, wherein the ferroelectric material is an organic-inorganic compound comprising triglycine sulfate, H-1,4-diazabicyclo[2.2.2]octane ammonium perrhenate (H-dabcoReO$_4$), trisarcosine calcium chloride, or a combination thereof.

7. The saturable absorber device of claim 1, wherein the doping level of the graphene-hybrid saturable absorber is dynamically modifiable via electrostatic gates to tune the resonant wavelength.

8. The saturable absorber device of claim 7, wherein the resonant wavelength for each laser pulse can be changed individually.

9. The saturable absorber device of claim 1, wherein the ferroelectric material is a ferroelectric thin film.

10. The saturable absorber device of claim 1, wherein the graphene substrate is patterned in a micro-shape structure, comprising a circular array, a micro-ribbon array, or a combination thereof.

11. The saturable absorber device of claim 1, wherein the optical element comprises an optical fiber.

12. A fiber laser, comprising:
    a ring or linear laser cavity; and
    a saturated absorber device arranged within the laser cavity, the saturable device, comprising: an optical element, and a saturable absorber material supported by the optical element, the saturable absorber material, comprising ferroelectric material and a graphene substrate, wherein the graphene substrate is layered with the ferroelectric material to form a gate tunable graphene-ferroelectric hybrid saturable absorber.

13. The fiber laser of claim 12, wherein the saturable absorber device is configured in the laser cavity so as to provide at least one of: wavelength tuning, mode-locking, Q-switching, optical pulse shaping, optical switching, and optical signal processing.

14. The fiber laser of claim 12, wherein the ferroelectric material is
    1) a polymer or copolymer comprising vinylidene fluoride, trifluoroethylene, 11-aminoundecanoic acid, thiourea, or a combination thereof;
    2) a ceramic material comprising bismuth ferrite, barium titanate, lead titanate, sodium nitrite, potassium phosphate, or a combination thereof;
    3) a hydrogen-bonded supramolecule polymer or copolymer comprising 5,5'-dimethyl-2,2'-bipyridine, 2,5-dichloro-3,6-dihydroxy-p-benzoquinone, 2,5-dibromo-3,6-dihydroxy-p-benzoquinone, 2,5-diiodo-3,6-dihydroxy-p-benzoquinone, or a combination thereof; or
    4) an organic-inorganic compound comprising triglycine sulfate, H-1,4-diazabicyclo[2.2.2]octane ammonium perrhenate (H-dabcoReO$_4$), trisarcosine calcium chloride, or a combination thereof.

15. The fiber laser of claim 12, wherein the optical element comprises an optical fiber optionally containing a mode lock assembly.

16. The fiber laser of claim 15, wherein the optical fiber and the saturable absorber material are mounted with a mode locker assembly.

17. A method of forming the saturable absorber device of claim 1, comprising:
    a) providing an optical element; and
    b) supporting with the optical element a saturable absorber material comprising a ferroelectric material and a graphene substrate.

18. A method of fabricating the saturable absorber material, comprising:
    a) depositing a layer of graphene onto a substrate by template-directed chemical vapor deposition (CVD);
    b) depositing a layer of ferroelectric material onto the graphene;
    c) removing the substrate via wet chemical etching; and
    d) doping the material from step (c) by applying an electric field to thereby obtain the graphene-ferroelectric hybrid saturable absorber material.

19. The method of claim 18, wherein step (b) through step (c) are performed using roll-to-roll technique.

20. The method of claim 18, wherein step (d) is performed using corona poling technique to obtain the desired remnant polarization state of the ferroelectric material layer.

* * * * *